US012750951B2

(12) United States Patent
Xiong et al.

(10) Patent No.: US 12,750,951 B2
(45) Date of Patent: Sep. 29, 2026

(54) POL INTEGRATED POWER SUPPLY MODULE AND PRODUCTION PROCESS FOR IMPROVING RELIABILITY

(71) Applicant: MetaPWR Electronics Co., Ltd., Shanghai (CN)

(72) Inventors: Yahong Xiong, Shanghai (CN); Zhengyang Liu, Shanghai (CN); Mingzhun Zhang, Shanghai (CN)

(73) Assignee: MetaPWR Electronics Co., Ltd., Shanghai (CN)

( * ) Notice: Subject to any disclaimer, the term of this patent is extended or adjusted under 35 U.S.C. 154(b) by 85 days.

(21) Appl. No.: 18/890,790

(22) Filed: Sep. 20, 2024

(65) Prior Publication Data

US 2025/0106990 A1 Mar. 27, 2025

(30) Foreign Application Priority Data

Sep. 21, 2023 (CN) ........................ 202311225612.6

(51) Int. Cl.

| | |
|---|---|
| ***H05K 1/02*** | (2006.01) |
| ***H01F 27/24*** | (2006.01) |
| ***H01F 27/28*** | (2006.01) |
| ***H05K 1/181*** | (2026.01) |
| ***H05K 7/14*** | (2006.01) |

(52) U.S. Cl.

CPC ........... *H05K 1/0296* (2013.01); *H01F 27/24* (2013.01); *H01F 27/28* (2013.01); *H05K 1/181* (2013.01); *H05K 7/1427* (2013.01); *H05K 2201/1003* (2013.01)

(58) Field of Classification Search

CPC .... H05K 1/0296; H05K 1/181; H05K 7/1427; H05K 2201/1003; H01F 27/24; H01F 27/28; H01F 27/2804

See application file for complete search history.

(56) References Cited

U.S. PATENT DOCUMENTS

| | | | | |
|---|---|---|---|---|
| 9,263,177 | B1 * | 2/2016 | Ikriannikov ........ | H01F 17/0013 |
| 2009/0175014 | A1 * | 7/2009 | Zeng ..................... | H02M 3/003 361/782 |
| 2013/0201645 | A1 * | 8/2013 | Catalano ............... | H01F 27/306 336/221 |
| 2022/0102054 | A1 * | 3/2022 | Xiong ................... | H01F 27/263 |
| 2022/0285075 | A1 * | 9/2022 | Zhang ................... | H01F 27/263 |

* cited by examiner

*Primary Examiner* — David D Davis
(74) *Attorney, Agent, or Firm* — JCIPRNET

(57) ABSTRACT

The application discloses a POL integrated power supply module and a production process thereof. The POL integrated power supply module comprises an inductor assembly, a substrate, a switch unit and an input capacitor. The substrate comprises a first surface and a second surface which are opposite, the inductor assembly is arranged on the second surface of the substrate, and the switch unit and the input capacitor are arranged on the first surface of the substrate. According to the POL integrated power supply module, a structural layout is provided, and the ultrathin thickness of the POL integrated power supply module is achieved. According to the POL integrated power supply module with the structure, a corresponding production process is provided, the production process is simplified, and the reliability of the POL integrated power supply module is improved.

22 Claims, 8 Drawing Sheets

POL INTEGRATED POWER SUPPLY MODULE AND PRODUCTION PROCESS FOR IMPROVING RELIABILITY

CROSS-REFERENCE TO RELATED APPLICATION

This application claims the priority benefit of Chinese application serial no. 202311225612.6, filed on Sep. 21, 2023. The entirety of the above-mentioned patent application is hereby incorporated by reference herein and made a part of this specification.

BACKGROUND

Description of Related Art

In recent years, with the development of technologies such as optical communication, the volume of an optical communication module becomes smaller and smaller, and the integration level becomes higher and higher; and as the data communication rate of an optical module becomes higher and higher, more and more powerful processors (such as a DSP, an ASIC and the like) are applied. Along with the progress of semiconductor technology, the power supply voltage required by these processor loads is lower and lower, and is as low as 0.4V at present; and the power supply current required by these processor loads is continuously increased.

A processor load of an optical module is traditionally supplied using an integrated power module comprises a point-of-load (POL, Point-of-Load) switch buck regulator. According to the POL integrated power supply module for low-voltage high-current output, how to improve the efficiency, reduce the height and improve the power density is a key for meeting the power supply requirement of the optical module, and is also a core problem designed by the POL integrated power supply module. In addition, along with the continuous increase of the load current of the processor and the high environment temperature, the heat dissipation problem of the POL power supply module is a key problem needing to be considered.

SUMMARY

The application aims to provide a POL integrated power supply module characterized by comprising an inductor assembly, a substrate, a switch unit and an input capacitor. The substrate comprises a first surface and a second surface which are opposite to each other, the inductor assembly is arranged on the second surface of the substrate, and the switch unit and the input capacitor are arranged on the first surface of the substrate.

The inductor assembly comprises a first surface and a second surface which are opposite to each other, a magnetic core, a winding and a power connecting piece, and the power connecting piece comprises two VIN power connecting pieces and two GND power connecting pieces. The winding, the VIN power connecting piece, the GND power connecting piece and the magnetic material are integrally formed through pressing to form a magnetic core and the inductor assembly.

Each power connecting piece comprises a first end surface and a second end surface. The winding comprises a first end, a second end, a winding main body, a first end surface and a second end surface. The winding main body extends from the first end to the second end of the winding in the direction of the first surface of the inductor assembly, the first end surface of each winding is exposed out of the first surface of the inductor assembly, and the second end surface of each winding is exposed out of the second surface of the inductor assembly.

The two GND power connecting pieces are arranged adjacent to the first end of the winding and are respectively arranged on two opposite sides of the first end of the winding; and the two VIN power connecting pieces are arranged on the two opposite sides of the first end of the winding respectively and are arranged adjacent to the corresponding GND power connecting pieces respectively.

Preferably, the inductor assembly and the substrate form a plastic packaging body through plastic packaging, the plastic packaging body comprises a side surface and a bottom surface, the second surface of the part of the inductor assembly is exposed out of the bottom surface of the plastic packaging body, and the second end of the winding and the second end of each power connecting piece are exposed to the bottom surface of the plastic packaging body.

Preferably, the plastic packaging body wraps the first surface of the substrate, the switch unit and the input capacitor of the substrate; the plastic packaging body further comprises a top surface, and the top surface is an insulating surface.

Preferably, the POL integrated power supply module further comprises a signal connecting piece, and the signal connecting piece covers part of the bottom surface of the plastic packaging body and part of the side surface of the plastic packaging body.

Preferably, the signal connecting piece is a half-hole electroplating piece.

Preferably, the signal connecting piece penetrates through the plastic packaging body until the second surface of the substrate and is electrically connected with the switch unit through the substrate.

Preferably, the signal connecting piece penetrates through the plastic packaging body and the substrate and is electrically connected with the switch unit through the substrate.

Preferably, the POL integrated power supply module further comprises a bonding pad, the bonding pad is arranged on the bottom surface of the plastic packaging body, the bonding pad is connected with the second end surface of the winding, the second end surface of each power connecting piece and the signal connecting piece.

Preferably, the bonding pad, the inductor assembly, the substrate and the switch unit are sequentially stacked.

Preferably, the input capacitors are respectively arranged on two opposite sides of the switch unit; each switch unit comprises two pairs of input pins and ground pins, and the input capacitors are bridged between each pair of input pins and ground pins.

Preferably, an input loop formed by the VIN power connecting piece, the GND power connecting piece and the input capacitor has a resonant frequency fcl; and the POL integrated power supply module is provided with a switching frequency fsw, and the resonant frequency fcl and the switching frequency fsw meet the condition that $(1/3)*fsw \le fcl \le (2/3)*fsw$.

Preferably, the resonant frequency fcl is half of the switching frequency fsw.

Preferably, the substrate comprises one of a printed circuit board or a ceramic substrate.

Preferably, the substrate is a copper foil.

Preferably, the copper foil wrapping is prefabricated and formed, or the copper foil is arranged on the inductor assembly and then is etched to form a circuit diagram.

Preferably, wherein the POL integrated power supply module is used for vertical power supplying to a processor load of the optical module.

The production process of the POL integrated power supply module comprises the following steps.

S1, pressing: integrally forming the power connecting piece, the winding and the magnetic material through pressing to form the inductor assembly.

S2, welding: executing a plurality of steps S1 to obtain a plurality of inductor assemblies, and preparing a connecting plate, wherein the connecting plate comprises a first surface and a second surface which are opposite. The inductor assemblies are arranged on the second surface of the connecting plate. The first end surface of the winding and the first end surface of each power connecting piece are welded to the bonding pads corresponding to the connecting plate respectively. The inductor assemblies are arranged in a two-dimensional array. Adjacent inductor assemblies are arranged in a mirror symmetry mode, so that the arrangement positions of the signal connecting pieces are matched with each other, and the arrangement positions of the signal connecting pieces are located on the common edge between the inductor assemblies.

S3, plastic packaging: plastic packaging is carried out on the connecting plate and the inductor assembly, and part of plastic packaging materials on the bottom surface of the plastic packaging body are removed through laser after plastic packaging, so that part of the second surface of the inductor assembly is exposed out of the bottom surface of the plastic packaging body, and the second end surface of the winding and the second end surface of each power connecting piece are exposed out of the bottom surface of the plastic packaging body.

S4, drilling and electroplating: in the arrangement position of the signal connecting piece, drilling the plastic packaging body from the bottom of the plastic packaging body to form a through hole, wherein the through hole penetrates through the plastic packaging body. The exposed surface is electroplated to form an electroplated layer, wherein the exposed surface includes the side wall of the through hole and the second surface of the inductor assembly.

S5, etching: etching the electroplating layer to form a conductive pattern, and forming a plurality of bonding pads.

S6, secondary welding: welding the switch unit and the input capacitor on a first surface of the connecting plate.

S7, dividing plates: dividing plates along the common edge, so that the side walls of the through holes are divided into two half-hole electroplating pieces to form the signal connecting piece.

Preferably, in the step S4, the through hole further penetrates through the connecting plate; and the two ends of the signal connecting piece are electrically connected with the first surface of the connecting plate and the second surface of the inductor assembly respectively.

Preferably, the connecting plate is a connecting copper foil which is prefabricated and formed and is provided with a circuit diagram.

Preferably, the connecting plate is a connecting copper foil without a circuit diagram; and in step S5, the conductive pattern is etched on the connecting copper foil, and a plurality of bonding pads are formed.

Preferably, the connecting plate is a printed circuit board or a ceramic substrate, and the exposed surface in the step S4 also includes the first surface of the connecting plate.

Preferably, the layout of the two-dimensional array is set as an array arrangement of a 2×2 rectangular structure, and the arrangement position of the signal connecting piece is within a 2×2 rectangular structure.

Compared with the prior art, the application has the following beneficial effects:

(1) The application provides a structural layout to realize the ultrathin thickness of the POL integrated power supply module.

(2) Aiming at the structure of the POL integrated power supply module, a corresponding production process is provided, the production process is simplified, and the reliability of the POL integrated power supply module is improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
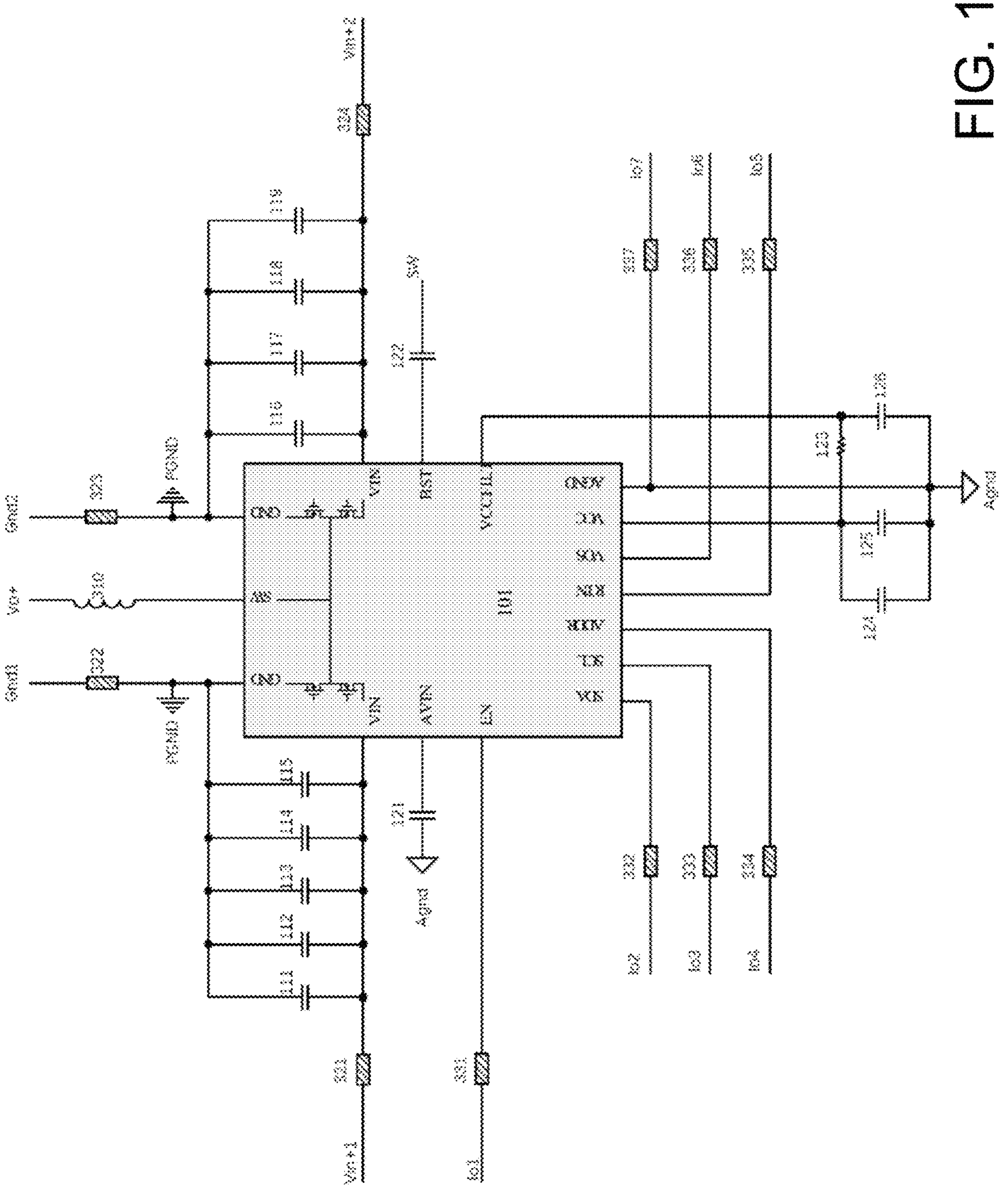
FIG. 1 is a schematic circuit diagram of a POL power supply module.

The present application discloses various embodiments or examples of implementing the thematic technological schemes mentioned. To simplify the disclosure, specific instances of each element and arrangement are described below. However, these are merely examples and do not limit the scope of protection of this application. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

The application aims to provide a POL integrated power supply module, which provides a structural layout and realizes the ultrathin thickness of the POL integrated power supply module. According to the POL integrated power supply module with the structure, a corresponding production process is provided, the production process is simplified, and the reliability of the POL integrated power supply module is improved.

The circuit schematic diagram of the POL integrated power supply module adopted by the application is shown in FIG. 1, and comprises a switch unit 101, input capacitors 111-119, an inductor 310, other passive devices 121-126, Vin+ power connecting pieces 321 and 324, GND power connecting pieces 322 and 323 and signal connecting pieces 331-337. Each switch unit 101 comprises two input pins Vin, two ground pins GND, one SW pin and a plurality of auxiliary power supply pins or signal pins; the switch unit 101 is divided into a left side and a right side along the center line of the switch unit 101, the SW pin is located at one end of the center line, a pair of input pin VIN and ground pin GND is arranged on the left side and another pair of input pin VIN and ground pin GND is arranged on the right side of the SW pin, and the auxiliary power supply pin or the signal pin and the like are all arranged at the position relatively far away from the SW pin. A switch, an input capacitor 111-119 and an inductor 310 in the switch unit 101 form a step-down circuit; specifically, the input capacitors 111-119 are bridged between each pair of input pin Vin and ground pin GND of each switch unit 101. The first ends of the Vin+ power connecting pieces 321 and 324 are respectively connected with two input pins Vin of the switch unit 101, and the second ends of the Vin+ power connecting pieces 321 and 324 respectively form two input positive pins of the POL integrated power supply module on the bottom surface of the POL integrated power supply module; the first ends of the GND power connecting pieces 322 and 323 are electrically connected with the two ground pins GND of the switch unit 101 respectively, and the second ends respectively form two ground pins on the bottom surface of the POL integrated power module; the first end of the inductor 310 is electrically connected with the SW pin of the switch unit 101, and the second end forms an output positive pin on the bottom surface of the POL integrated power module. In addition, the first ends of the signal connecting pieces 331-337 are electrically connected with a plurality of auxiliary power supply pins or signal pins of the switch unit 101 respectively, and the second ends respectively form a plurality of signal pins on the bottom surface of the POL integrated power supply module. The passive devices 121-126 are bridged between the auxiliary power supply pins or the signal pins or the power pins of the switch unit 101.

Embodiment 1

Figure 2A:
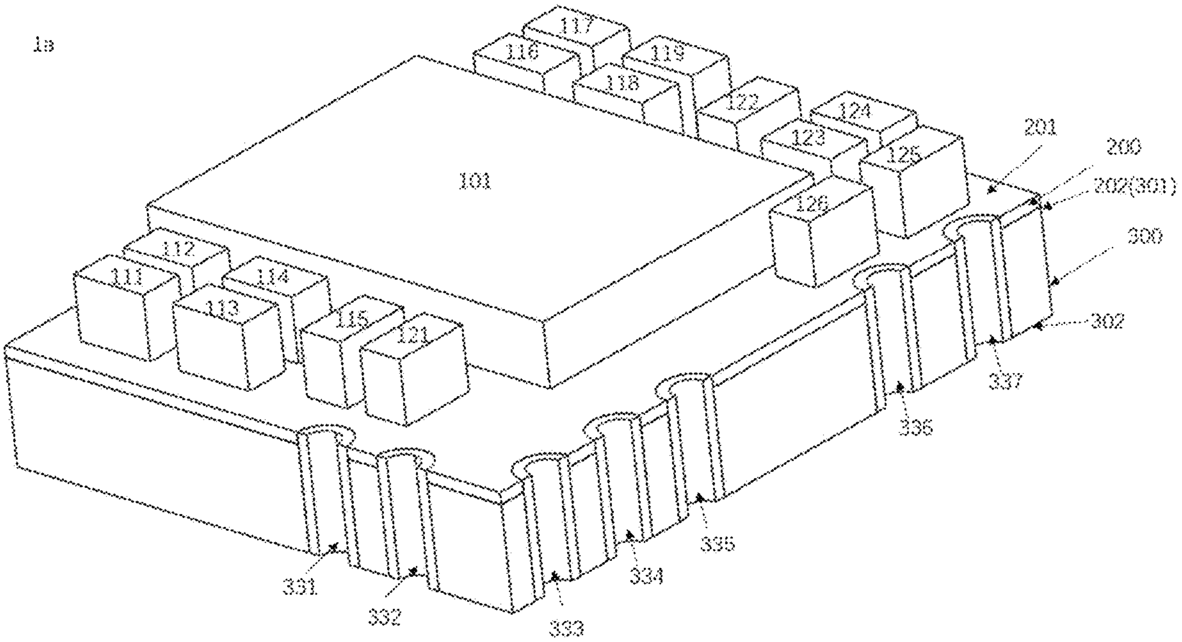
FIG. 2A is a top view of a POL integrated power supply module 1*a;*
Figure 2B:
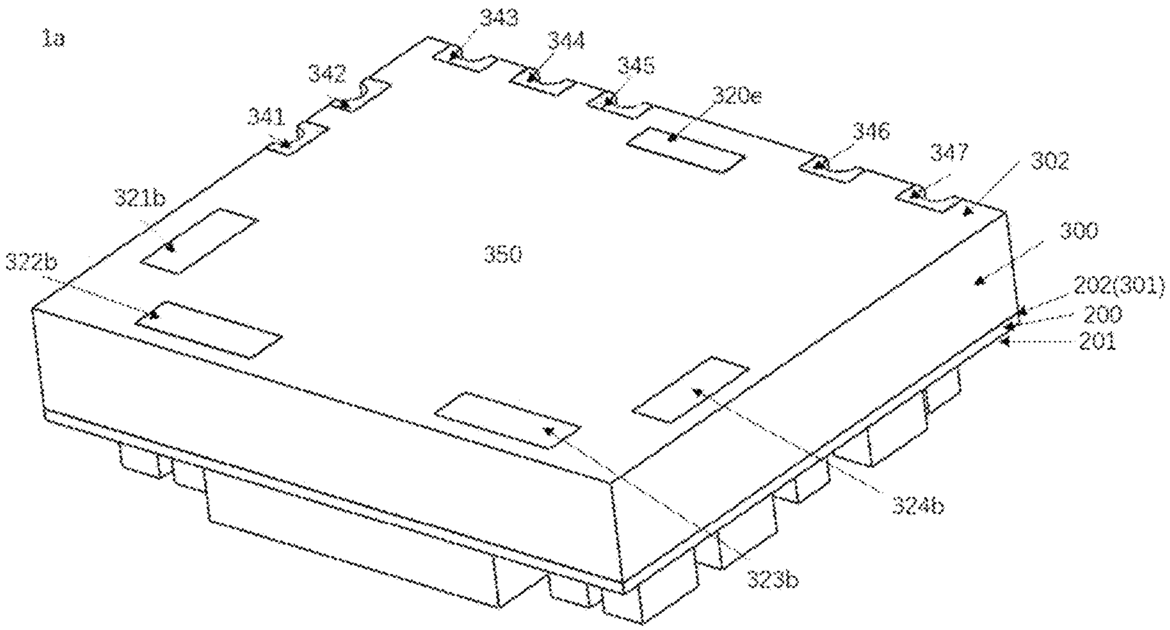
FIG. 2B is a bottom view of the POL integrated power supply module 1*a;*

The structural schematic diagram of the POL integrated power supply module 1*a* disclosed by the application is shown in FIGS. 2A and 2B, the top-view three-dimensional schematic diagram of the POL integrated power supply module 1*a* is shown in FIG. 2A, and the bottom-view three-dimensional schematic diagram of the POL integrated power supply module 1*a* is shown in FIG. 2B. The POL integrated power supply module 1*a* comprises a circuit substrate 200, an inductor unit 300, input capacitors 111-119, and other passive devices 121-126; the input capacitors 111-119 and the other passive devices 121-126 are collectively referred to as devices 111-126, the circuit substrate 200 comprises a first surface 201 and a second surface 202 opposite to each other, and the devices 111-126 are arranged and welded on the first surface 201 of the circuit substrate 200; and the inductor unit 300 is arranged and welded on the second surface 202 of the circuit substrate 200, and the inductor unit 300 and the second surface 202 of the circuit substrate 200 are bonded together through a plastic packaging material in the inductor unit 300. The inductor unit 300 comprises a first surface 301 and a second surface 302 opposite to each other, and a first surface 301 of the inductor unit 300 is arranged adjacent to a second surface 202 of the circuit substrate 200. In the embodiment, the POL integrated power supply module adopts an up-down stacking structure, namely the devices 111-126 and the inductor unit 300 are arranged on the two opposite sides of the circuit substrate 200 respectively, so that from the bottom to the top of the POL integrated power supply module is a POL integrated power supply module pin, and the inductor unit 300, the circuit substrate 200 and the switch unit 101 are sequentially stacked; and a plurality of input capacitors 111-119, which are respectively arranged on two sides of the switch unit 101, are arranged adjacent to two pairs of input pin Vin and ground pin GND of the switch unit 101, and are bridged between each pair of input pin Vin and the ground pin GND, so as to reduce loop parasitic parameters between the input capacitors 111-119 and the switch unit 101, and meet the requirement of the POL integrated power supply module on the capacitance value of the input capacitor.

Referring to FIG. 2A and FIG. 2B, the POL integrated power supply module 1*a* comprises signal connecting pieces 331-337, the signal connecting pieces 331-337 are arranged on the side surfaces of the inductor unit 300 and the circuit substrate 200, and sequentially penetrate through the first surface 201 and the second surface 202 of the circuit substrate 200 and the first surface 301 and the second surface 302 of the inductor unit 300. The signal connecting pieces 331-337 are used for electrically connecting the auxiliary power supply pins or the signal pins of the switch unit 101 with the signal pins of the POL integrated power supply module, so that signal transmission between the switch unit 101 and the welding mainboard of the POL integrated power supply module is realized.

Referring to FIG. 2B, the bottom surface of the POL integrated power supply module 1*a* comprises two input positive pins 321*b*/324*b*, two ground pins 322*b*/323*b*, and one output positive pin 320*e*. The power pins are different from the signal connecting pieces 331-337, the power pins are only exposed to the bottom surface of the inductor unit 300, and are not exposed to the side surfaces of the inductor unit 300.

Figure 3A:
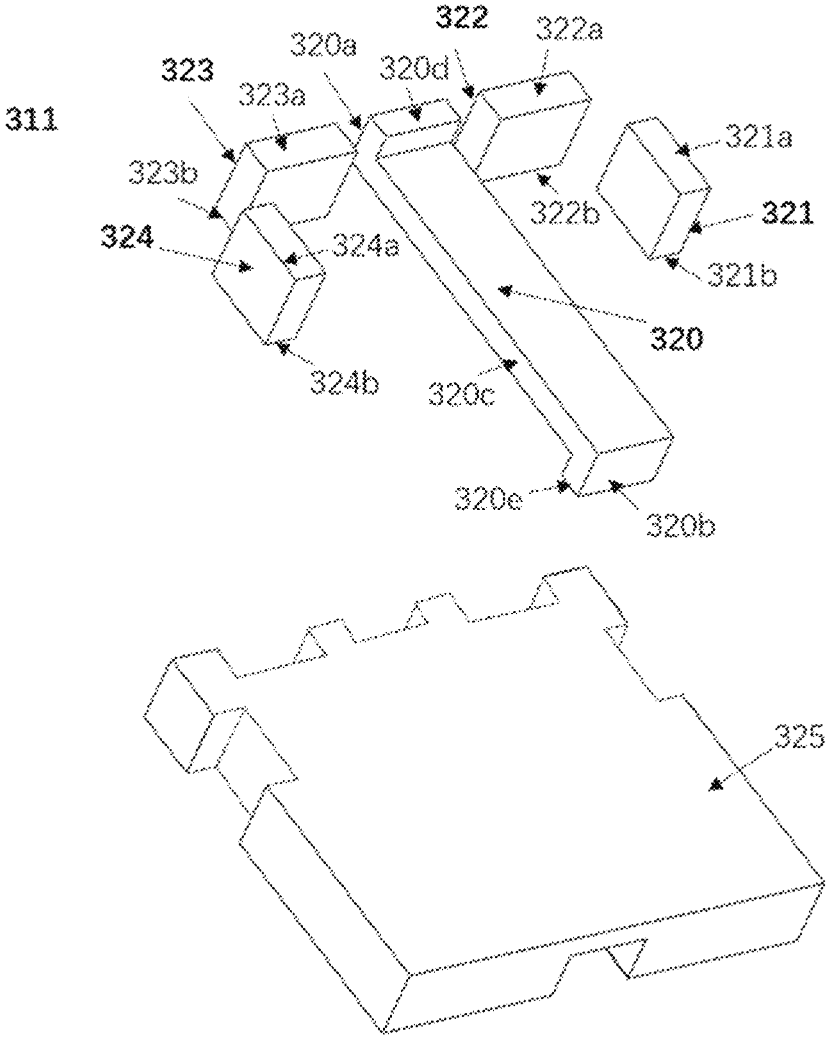
FIG. 3A to FIG. 3C are a three-dimensional exploded view and a first production process of the inductor unit.

FIG. 3A is a three-dimensional exploded view of the inductor assembly 311 after removing the plastic package material, the inductor assembly 311 comprises an inductor 310, GND power connecting pieces 322 and 323 and Vin+ power connecting pieces 321 and 324. The inductor 310 comprises a magnetic core 325 and a winding 320; the winding 320 comprises a first end 320*a*, a winding main body 320*c* and a second end 320*b*; and the extending direction of the winding main body 320*c* from the first end 320*a* to the second end 320*b* is parallel to the first surface 301 or the second surface 302 of the inductor unit 300; the first end 320*a* extends towards the first surface 301, and the second end 320*b* extends towards the second surface 302; and the thickness of the inductor unit 300 is reduced by adopting the winding 320 of the horizontal structure, so that the ultrathin POL integrated power supply module is realized. GND power connecting pieces 322 and 323 are arranged adjacent to the first end 320*a* of the winding 320 and are respectively arranged on the two opposite sides of the first end 320*a*; and the Vin+ power connecting pieces 321 and 324 are arranged on the two opposite sides of the main body 320*c* of the winding 320 respectively. Referring to FIG. 3A, the Vin+ power connecting piece 321 is disposed adjacent to the GND power connecting piece 322, and the Vin+ power connecting piece 324 is disposed adjacent to the GND power connecting piece 323. Vin+ power connecting pieces 321/324 and GND power connecting pieces 322/323, the winding 320 and the magnetic material are integrally pressed to form a magnetic core 325 and an inductor assembly 311, so that the size of the inductor assembly 311 is reduced, and the production efficiency of the POL integrated power supply module is improved. In addition, referring to FIG. 2A, FIG. 2B and FIG. 3A, in the plastic-packaged inductor unit 300, the first end surface 320*d* of the winding 320, the first end surface 321*a*/324*a* of the Vin+ power connecting piece 321/324, and the first end surface 322*a*/323*a* of the GND power connecting piece 322/323 are exposed on first surface 301 of the inductor unit 300 to form a corresponding pad (not shown) for realizing welding between the inductor unit 311 and the circuit substrate 200; the second end surface 320*e* of the winding 320, the second end surface 321*b*/324*b* of the Vin+ power connecting piece 321/324 and the second end surface 322*b*/323*b* of the GND power connecting piece 322/323 are exposed on the second surface 302 of the inductor unit 300 to form a corresponding pad (not shown), that is, each pin of the POL integrated power supply module is used for realizing external welding and electrical connection of the POL integrated power supply module.

The Vin+ power connecting piece 321/324 and the GND power connecting piece 322/323 are electrically connected to both ends of the input capacitor 111-119 through the circuit substrate 200; so that the input capacitors 111-119 are also respectively arranged on two opposite sides of the switch unit 101, and are respectively arranged adjacent to the input pins Vin and the ground pins GND on the two sides of the switch unit 101; so that the area of the loop enclosed by the input capacitors 111-119 and the corresponding switches in the switch unit 101 is minimized; and on the other hand, the area of an input loop defined by the input capacitors 111-119, Vin+ power connecting pieces 321/324, GND power connecting pieces 322/323 and the external capacitors of the POL integrated power supply module is controlled, so that the magnitude of the parasitic inductance of the input loop is controlled. So that a specific relationship is satisfied between the resonant frequency fcl of the input loop parasitic inductance and the input capacitor 111-119 in parallel resonance and the switching frequency fsw of the POL integrated power supply module 1*a*, specifically, $(\frac{1}{3})*fsw \le fcl \le (\frac{2}{3})*fsw$. The advantage is that on one hand, the amplitude of the current ripple of external the input positive pin 321*b*/324*b* of the POL integrated power supply module can be effectively reduced, the current ripple is transmitted from the pulse current generated by the switch unit 101; and on the other hand, when the POL integrated power supply module generates load dynamic, the energy stored by the external input capacitor of the POL integrated power supply module can be effectively provided for the load, so that the dynamic response capability of the POL integrated power supply module is improved. In the embodiment, the resonant frequency fcl is used as half of the switching frequency fsw, so that the conversion efficiency and the dynamic response performance of the POL integrated power supply module are improved.

Meanwhile, in the embodiment, Vin+ power connecting pieces 321 and 324 in the inductor unit 300 are arranged adjacent to the Vin pin of the switch unit 101, the GND power connecting piece is arranged adjacent to the GND pin of the switch unit 101, and the first end surface 320*d* of the winding 320 is arranged close to the SW pin position of the switch unit 101. Therefore, the parasitic resistance of path that the power current flows through in the POL integrated inductor module is reduced, and the efficiency of the POL integrated inductor module is further improved.

Figure 3B:
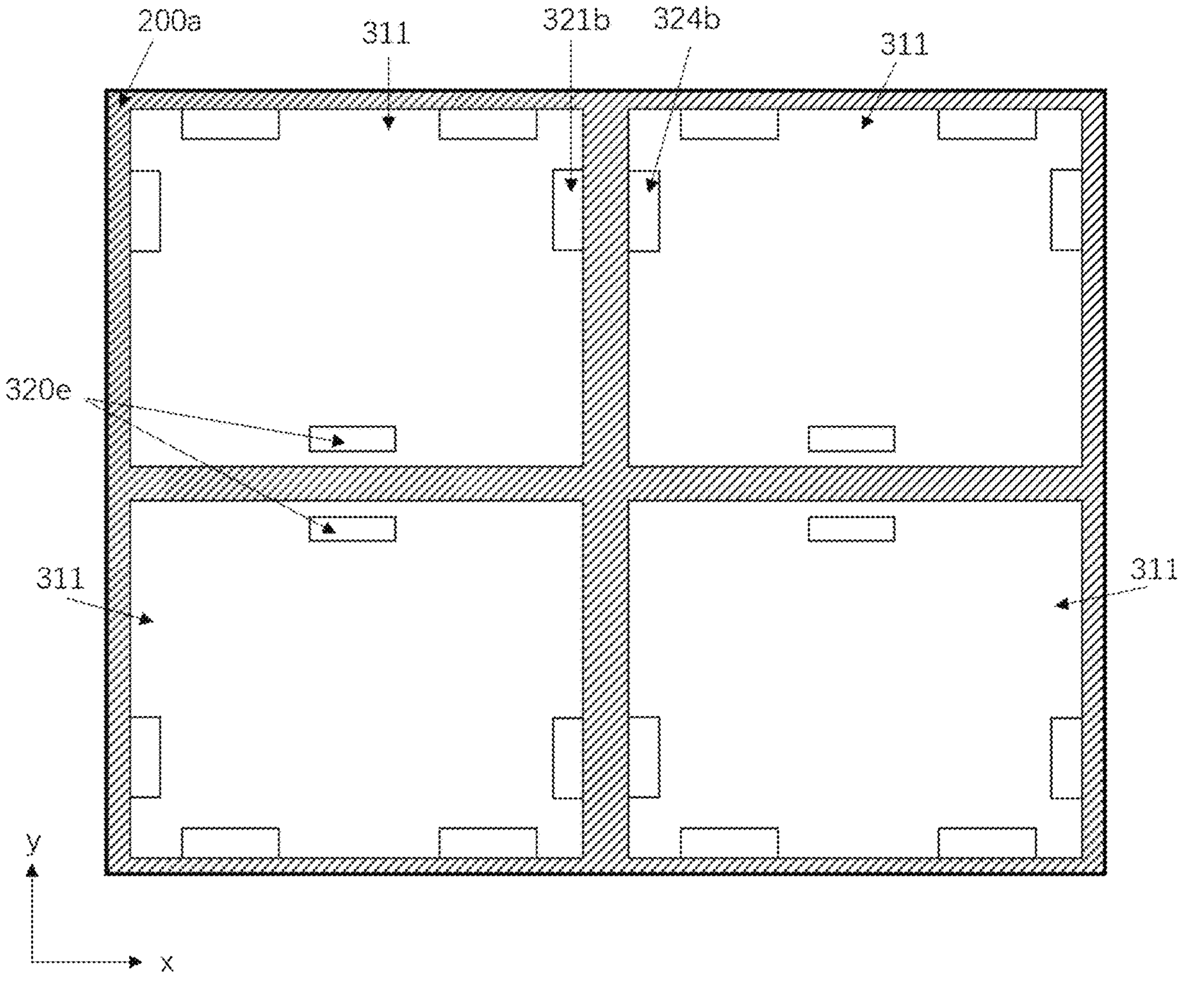
Figure 3C:
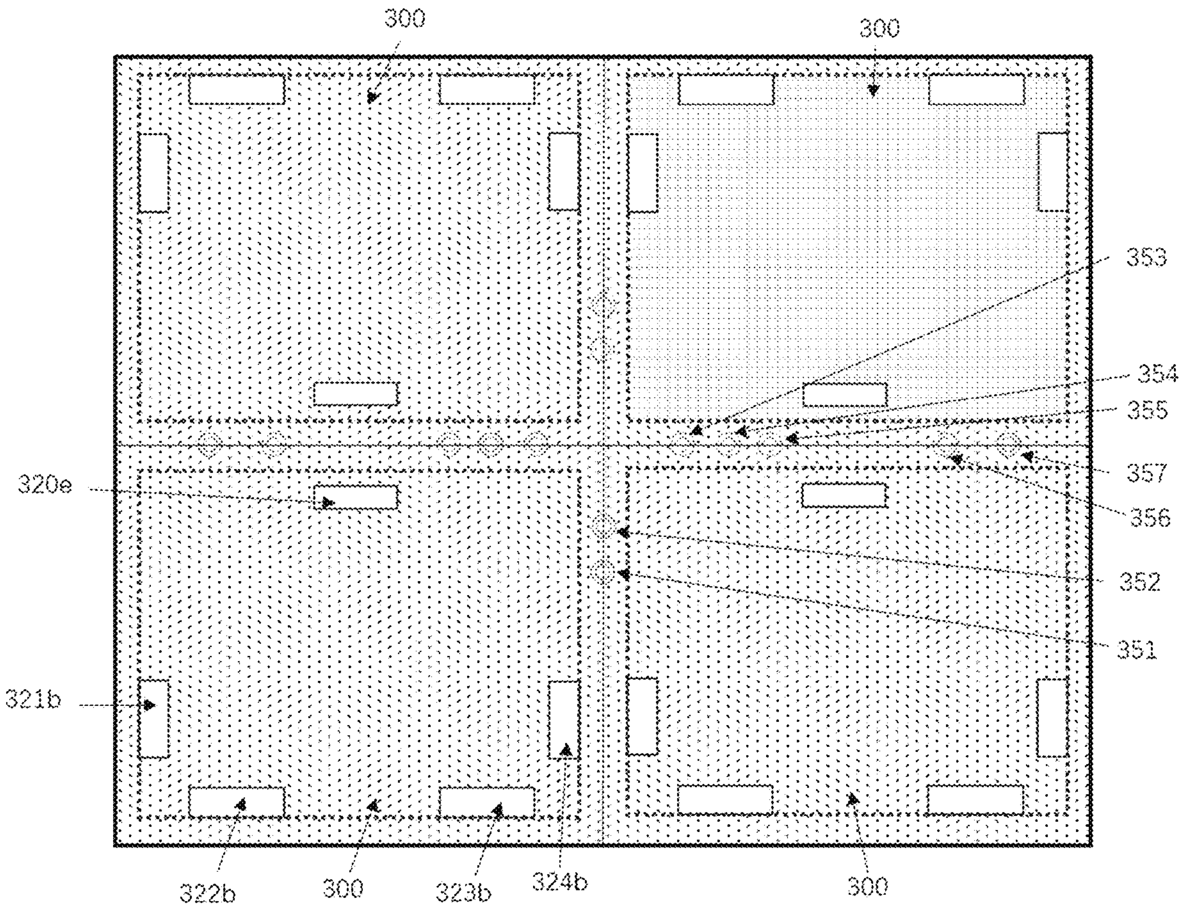
Figure 4A:
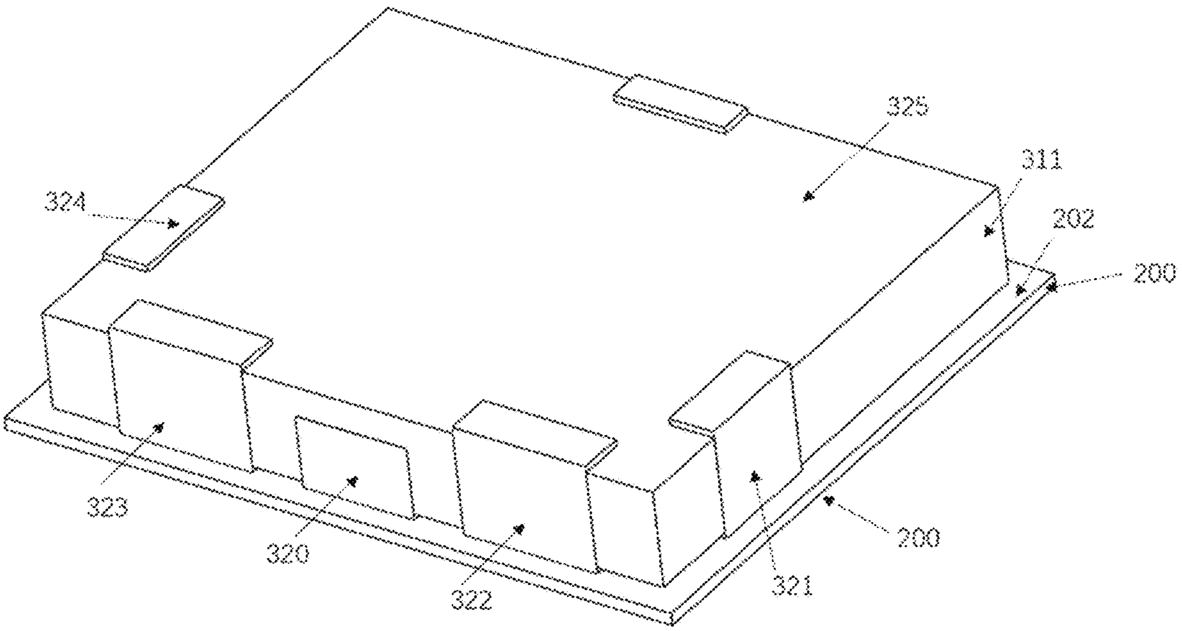
FIG. 4A to FIG. 4B are top view and a production process of the inductor assembly.
Figure 4B:
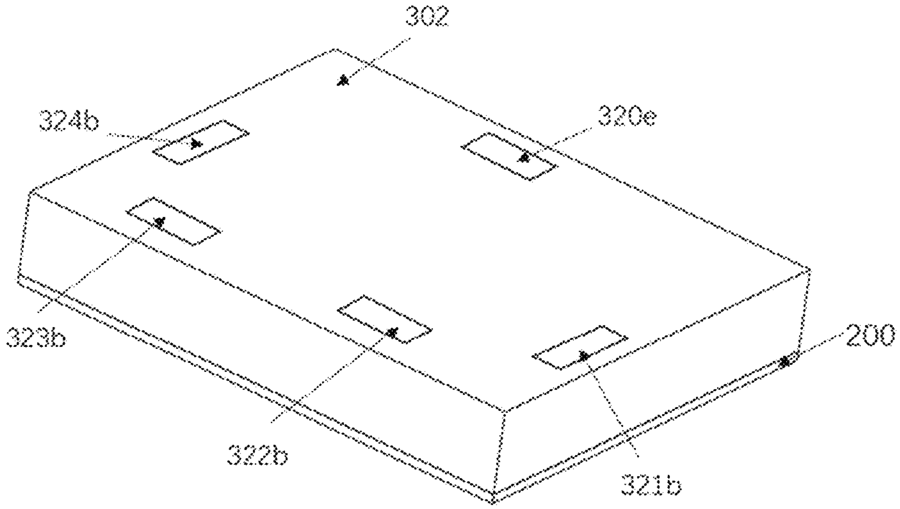

The POL power supply module in the embodiment is suitable for the application of the optical module and supplies power to the processor load of the optical module. Specifically, the bottom surface of the POL integrated power module is attached to one side of the optical module mainboard, the position of the POL integrated power module is opposite to the position of the processor load on the other side of the optical module mainboard, and the top surface of the POL integrated power module is attached to the metal shell of the optical module, so that the loss and heat generated by the switch unit 101 can be directly dissipated through the metal shell of the optical module. Compared with horizontal power supply—a traditional POL integrated power supply module and a processor load located on the same side of the optical module mainboard, the POL integrated power supply module and the processor load are arranged on the two sides of the optical module mainboard, and vertical power supply of the POL integrated power supply module to the processor load is achieved. The vertical power supply can greatly reduce the current path between the POL integrated power supply module and the processor load, reduce the voltage drop and loss on the transmission path, and greatly improve the power supply efficiency. The POL integrated power supply module is pins, and the inductor unit 300, the circuit substrate 200 and the switch unit 101 are sequentially stacked, so that the thermal resistance between the switch unit 101 of the POL integrated power supply module and the optical module metal shell is reduced, and the efficiency and reliability of the POL integrated power supply module are improved. FIG. 3A to FIG. 3C disclose a first production process of the POL integrated inductor module 1*a* The ultra-thin POL integrated power supply module can be better realized, the production process flow is simplified, and the production cost is reduced. FIG. 4A to FIG. 4B are a 3D the diagram of the POL integrated inductor module 1*a* during a production process I, wherein FIG. 4A is a top view of the inductor assembly 311 being welded on the second surface 202 of the circuit substrate 200; and FIG. 4B is a top view of the inductor assembly 311 being welded on the second surface 202 of the circuit substrate 200 and being molded. The production process I of the embodiment comprises a connecting plate 200*a*; the connecting plate 200*a* takes a connecting piece containing four circuit substrates 200 as an example, and the four circuit substrates 200 are arranged according to a 2λ2 rectangular structure.

The detailed steps of the production process are as follows:

S1, pressing: firstly, integrally pressing and sintering Vin+ power connecting piece 321/324 and GND power connecting piece 322/323, a winding 320 and magnetic material to form an inductor assembly 311, as shown in FIG. 3A and in FIG. 4A.

S2: welding: executing step S1 four times to obtain four inductor assemblies 311, preparing a connecting plate 200*a* as shown in FIG. 3B (the top view of the second surface of the connecting plate 200*a*), respectively arranging the four inductor assemblies 311 on the second surface of the connecting plate 200*a*, and the first end surface 320*d* of the winding 320, the first end surfaces 321*a*/324*a* of the Vin+ power connecting pieces 321/324 and the first end surfaces 322*a*/323*a* of the GND power connecting pieces 322/323 are respectively welded to the corresponding bonding pads on the second surface of the connecting plate 200*a*. Adjacent inductor assemblies 311 are arranged in a mirror symmetry mode, so that the arrangement positions of the signal connecting pieces 351-357 are matched with each other, and the arrangement positions of the signal connecting pieces 351-357 are located on the center line between the inductor assemblies 311 (equivalent to mirror symmetry mirror surfaces). Specifically, the two inductor assemblies 311 in the four inductor assemblies are arranged in the X-axis direction, and the second end surface 321*b* of one inductor assembly and the second end surface 324*b* of the Vin+ power connecting piece 324 of the other inductor assembly are arranged adjacently; and the two inductor assemblies 311 in the four inductor assemblies are arranged in the Y-axis direction, and the second end surfaces 320*e* of the windings 320 of the two inductor assemblies are arranged adjacent to each other. An appearance diagram formed by the second surface 202 of the circuit substrate 200 welded to each inductor assembly 311 is as shown in FIG. 4A.

S3 plastic packaging: plastic packaging is carried out on the connecting plate 200*a* and the four inductor assemblies 311 in FIG. 3B, part of plastic packaging material on the bottom surface of the plastic packaging body is removed through laser after plastic packaging. The second end surface 320*e* of the winding 320, the second end surface 321*b*/324*b* of the Vin+ power connecting piece 321/324 and the second end surface 322*b*/323*b* of the GND power connecting piece 322/323 are exposed out of the second surface 202 of the circuit substrate 200. Each inductor assemblies 311 are welded on the second surface 202 of the circuit substrate 200, and plastic packaging to form the package body as shown in FIG. 4B.

S4, drilling and electroplating: as shown in FIG. 3B, the second surface of the connecting plate 200*a* is subjected to plastic packaging and a top view after drilling; on the second surface 302 of the two inductor units 300, drilling through holes 351-357 between the two inductor units, the through holes 351-357 penetrate through the plastic package body and the circuit substrate 200. The through holes 351-357 overlaps in the vertical direction with the signal network wiring reserved by the circuit substrate 200, that is, the through holes 351-357 respectively penetrate through corresponding signal network wiring on the circuit substrate 200, and the signal network wiring is exposed to the side edge of the through hole, specifically as shown in FIG. 3C. Electroplating the through hole 351-357, the first surface of the connecting plate 200*a* and the second surface 302 of the inductor unit 300; the side wall of the through hole 351-357, the exposed part of the connecting plate 200*a* and the exposed part of the inductor unit 300 are covered by electroplated copper; and in this way, the first surface of the connecting plate 200*a* is electrically connected with the second surface 302 of the inductor unit 300 through electroplating of the side wall of the through hole 351-357.

S5 etching: etching a conductive pattern on the first surface of the connecting plate 200*a* and the second surface 302 of the inductor unit 300, then forming a plurality of bonding pads. a bonding pad on a first surface of the connecting plate 200*a* is used for welding parts such as the switch unit 101, the input capacitor 111-119 and other passive devices 121-126; and bonding pads on the second surface 302 of the inductor unit 300 is used for forming pins of the POL integrated power supply module.

S6, secondary welding: welding the switch unit 101, the input capacitors 111-119 and other passive devices 121-126 on corresponding pads on the first surface of the connecting plate 200*a*.

S7, dividing plates: dividing the through holes 351/352 along the center connecting line and dividing the through holes 353-357 along the center connecting line, dividing the through holes 351-357 into two groups of half holes 331-337, and exposing the side walls of the half holes 331-337 to the dividing surface, i.e., forming the signal connecting pieces 331-337 of the POL integrated power supply module, the three-dimensional structure diagram of the signal connecting pieces 331-337 being as shown in FIG. 2A.

In the present application, the circuit substrate 200 may be a printed circuit board, or may be a carrier plate or a ceramic substrate; the material to adhere the inductor unit 300 and the circuit substrate 200 may be bonded together as a plastic packaging material, or may be a PREPRG material of a PCB, etc.; however, the present disclosure is not limited thereto.

Embodiment 2

Figure 5:
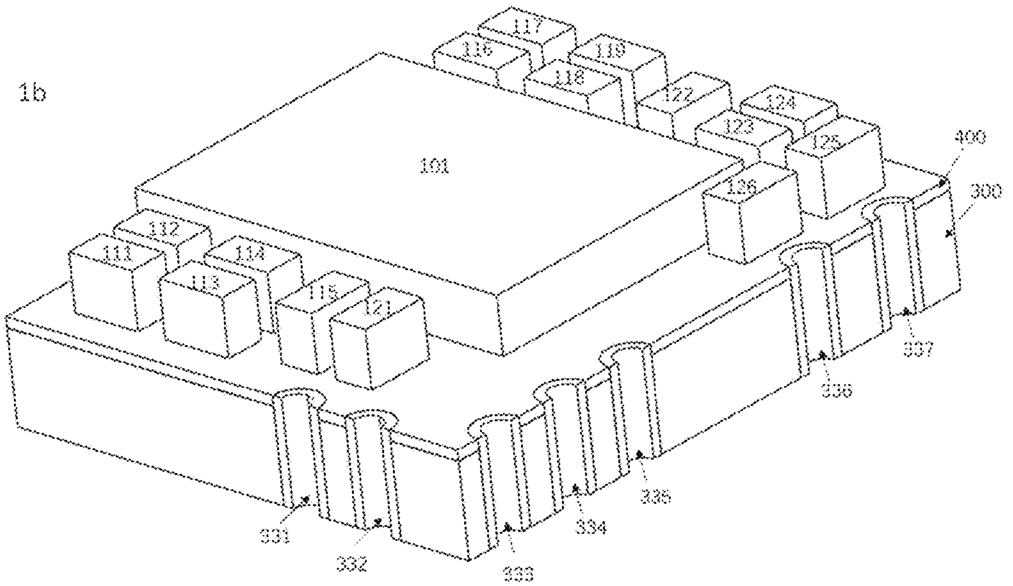
FIG. 5 is a top view of a POL integrated power supply module 1*b;*

In the second embodiment disclosed by the application, as shown in FIG. 5, the POL integrated power supply module 1*b* and the copper foil 400 are used for replacing the circuit substrate 200, so that the thickness of the POL integrated power supply module can be further reduced. As shown in FIG. 5, the copper foil 400 comprise a first surface 401 and a second surface 402 that are opposite to each other. The copper foil 400 herein may be a connecting sheet which is prefabricated and formed and is provided with a circuit diagram. The copper foil 400 may also be a connecting sheet which is prefabricated and formed without a circuit diagram in a preset manner. After being welded to and plastic-packaged with the inductor assembly 311, a required circuit diagram is formed on the first surface 401 by means of etching.

Embodiment 3

Figure 6:
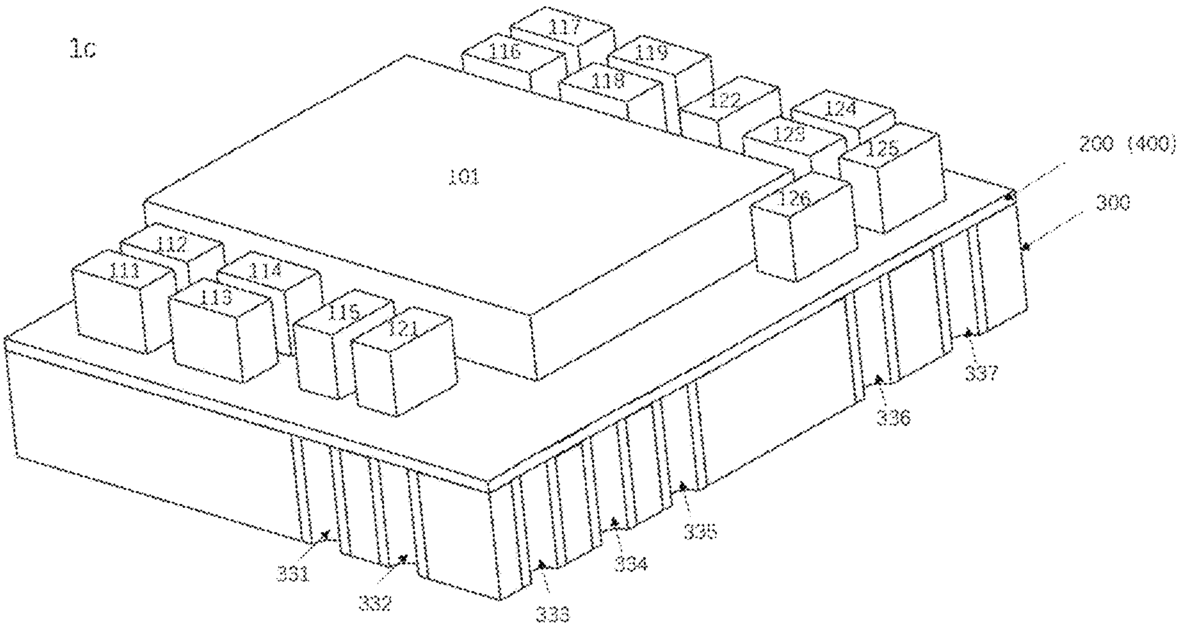
FIG. 6 is a top view of a POL integrated power supply module 1*c;*

The application further discloses another POL integrated power supply module. As shown in FIG. 6, the difference between the POL integrated power supply module 1*c* and 1*a* is that the signal connecting pieces 331-337 only penetrate through the plastic package body and do not penetrate through the circuit substrate 200*a* in the POL integrated power supply module 1*c*; the signal connecting pieces 331-337 are electrically connected with the conductors on the second surface 202 of the circuit substrate 200 through electroplating, and the signal connecting pieces 331-337 are electrically connected with the switch unit 101 through wires on the circuit substrate 200. The advantage is that the usable area of the first surface 201 of the circuit substrate 200 becomes larger, and the power density of the POL integrated power supply module is improved.

Embodiment 4

Figure 7A:
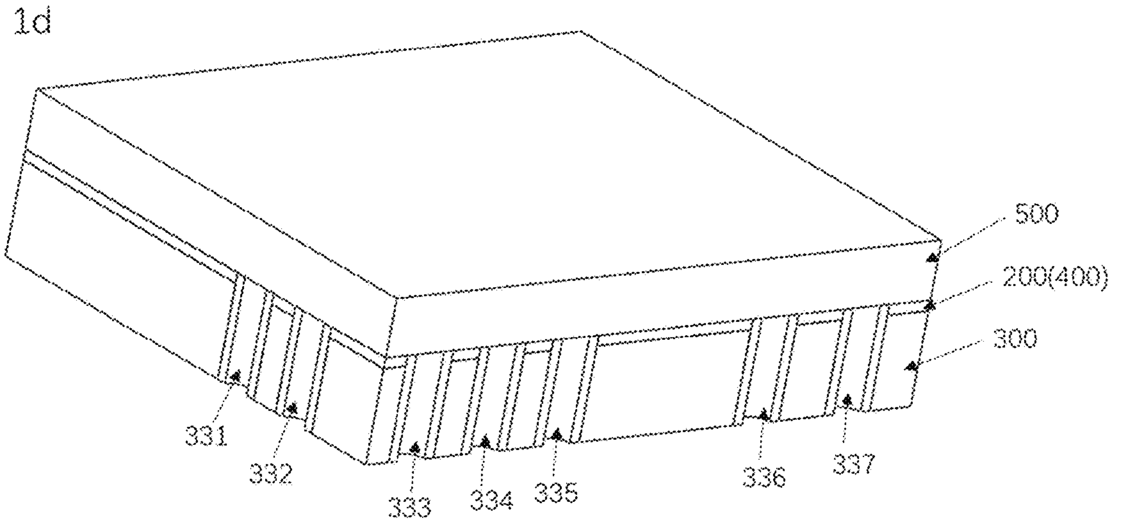
FIG. 7A is a top view of a POL integrated power supply module 1*d;*
Figure 7B:
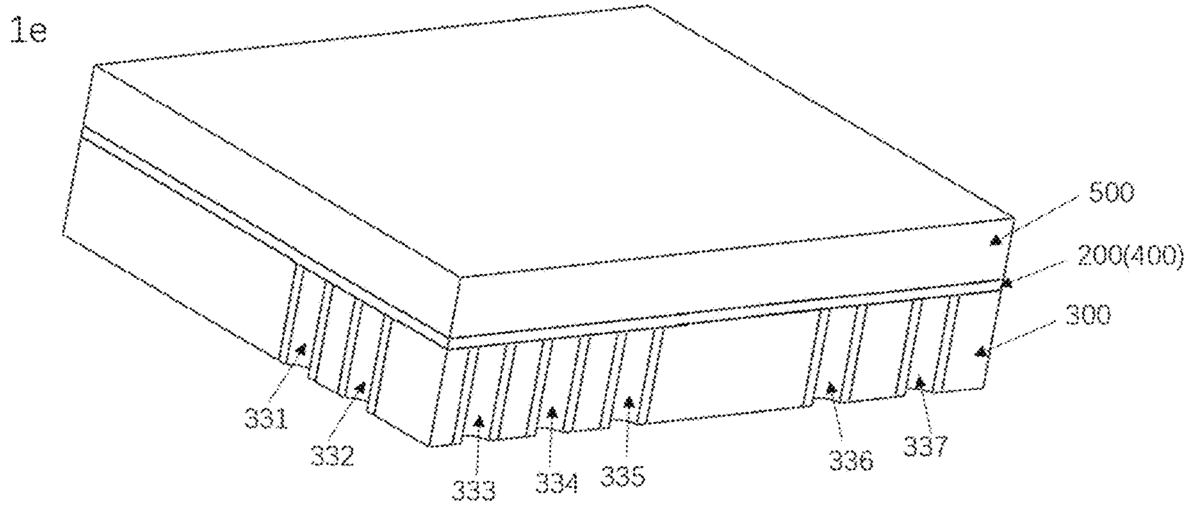
FIG. 7B is a top view of a POL integrated power supply module 1*e*.

The application further discloses a POL integrated power supply module 1*d* and a POL integrated power supply module 1*e*, the FIG. 7A is a three-dimensional structure diagram of the POL integrated power supply module 1*d*, and FIG. 7B is a three-dimensional structure diagram of the POL integrated power supply module 1*e*. The POL integrated power supply module 1*d* is similar to the POL integrated power supply module 1*a* in structure, and the POL integrated power supply module 1*e* is similar to the POL integrated power supply module 1*c* in structure; and the difference lies in that 1) in the POL integrated power supply modules 1*d* and 1*e* both enable the switch unit 101, the input capacitors 111-119 and the other passive devices 121-126 are packaged together with the circuit substrate 200 and the inductor 310, so that the switch unit 101, the input capacitors 111-119 and the other passive devices 121-126 are coated by the plastic packaging material; and the advantages are that when the power supply module is welded on the mainboard, high-temperature remelting occurs on a welding spot between the device on the first surface 201 of the circuit substrate 200 and the circuit substrate 200, so that the failure of the power module caused by displacement or falling of the device is prevented. 2) the signal connecting pieces 331-337 are side walls of the half holes and are exposed to the side surface of the POL integrated module power supply 1*d*, but the side walls of the half holes 331-337 of the POL integrated power supply module 1*d* only penetrate through the plastic package of the inductor unit 300 and penetrate through the circuit substrate 200, and do not penetrate through the plastic package on the first surface 201 of the circuit substrate; the side wall of the half-holes 331-337 of the POL integrated power supply module 1*e* only penetrate through the plastic package of the inductor unit 300, and not penetrate through the circuit substrate 200 and the plastic package on the first surface 201 of the circuit substrate. The advantage is that the signal connecting piece 331-337 realizes the electrical connection between the signal pins of the POL integrated module power supply 1*d* or 1*e* and the circuit substrate 200, and there is no conductive network on the top surface of the POL integrated module power supply 1*d* or 1*e*, thereby realizing the surface insulation of the power supply 1*d* or 1*e* of the POL integrated module.

In detail, the difference between the production process II corresponding to the POL integrated power supply module 1*d* shown in FIG. 7A and the production process I lies in that the inductor 310 are welded on the connecting piece of the circuit substrate 200*a* and then carry out plastic packaging; and in the production process II, the inductor 310, the switch unit 101, the input capacitor 111-119 and the other passive devices 121-126 are welded on the connecting piece of the circuit substrate 200*a* and then carrying out plastic packaging. The production process corresponding to the structure of the POL integrated power supply module 1*e* shown in FIG. 7B can refer to that of the production process II. In the structure shown in FIG. 7A and FIG. 7B, the circuit substrate 200 can also be replaced by the copper foil 400, and the technical features and advantages thereof are the same as those of the second embodiment.

The switch unit 101, the input capacitors 111-119 and the other passive devices 121-126 shown in FIG. 7A and FIG. 7B can also be implemented by means of embedding in a circuit substrate, the switch unit 101, the input capacitors 111-119 and the other passive devices 121-126 are embedded in the circuit substrate 200. Compared with a first production process, the device welding and plastic packaging on the first surface 201 of the circuit substrate 200 can be saved by means of embedded the devices in the circuit substrate. The POL integrated power supply module has the advantages of simple structure, simple production process and reliability improvement.

The switch disclosed by the application can be a Si MOSFET, SiC MOSFET, GaN MOSFET or IGBT MOSFET and etc, and the function of the switch disclosed by the application can be realized.

The power supply module can be part of the electronic device or an independent power supply module as long as the technical features and advantages disclosed by the application can be satisfied.

The "equal" or "same" or "equal to" disclosed by the application needs to consider the parameter distribution of engineering, and the error distribution is within +/−30%; the two line segments or the two straight lines are defined as the two line segments or the included angle between the two line segments or the two straight lines is less than or equal to 45 degrees; the included angle between the two line segments or the two straight lines is within the range of [60, 120]; and the definition of the phase error phase also needs to consider the parameter distribution of the project, and the error distribution of the phase error degree is within +/−30%.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A POL integrated power supply module is characterized by comprising an inductor assembly, a substrate, a switch unit and an input capacitor; the substrate comprises a first surface and a second surface which are opposite to each other, the inductor assembly is arranged on the second surface of the substrate, and the switch unit and the input capacitor are arranged on the first surface of the substrate;

the inductor assembly comprises a first surface and a second surface which are opposite to each other, a magnetic core, a winding and a power connecting piece, and the power connecting piece comprises two VIN power connecting pieces and two GND power connecting pieces; the winding, the two VIN power connecting pieces, the two GND power connecting pieces and a magnetic material are integrally formed through pressing to form a magnetic core and the inductor assembly;

each power connecting piece comprises a first end surface and a second end surface; the winding comprises a first end, a second end, a winding main body, a first end surface and a second end surface; the winding main body extends from the first end to the second end of the winding in a direction of the first surface of the inductor assembly, the first end surface of each winding is exposed out of the first surface of the inductor assembly, and the second end surface of each winding is exposed out of the second surface of the inductor assembly;

the two GND power connecting pieces are arranged adjacent to the first end of the winding and are respectively arranged on two opposite sides of the first end of the winding; and the two VIN power connecting pieces are arranged on the two opposite sides of the first end of the winding, respectively, and are arranged adjacent to the corresponding GND power connecting pieces respectively.

2. The POL integrated power supply module of claim 1, the inductor assembly and the substrate form a plastic packaging body through plastic packaging, the plastic packaging body comprises a side surface and a bottom surface, the second surface of a part of the inductor assembly is exposed out of the bottom surface of the plastic packaging body, and second end of the winding and the second end of each power connecting piece are exposed to the bottom surface of the plastic packaging body.

3. The POL integrated power supply module of claim 2, wherein the plastic packaging body wraps the first surface of the substrate, the switch unit and the input capacitor; the plastic packaging body further comprises a top surface, and the top surface is an insulating surface.

4. The POL integrated power supply module of claim 2, further comprises a signal connecting piece, and the signal connecting piece covers a part of the bottom surface of the plastic packaging body and a part of the side surface of the plastic packaging body.

5. The POL integrated power supply module of claim 4, wherein the signal connecting piece is a half-hole electroplating piece.

6. A production process of the POL integrated power supply module of claim 5, comprises the following steps:

S1, pressing: integrally forming the power connecting piece, the winding and the magnetic material through pressing to form the inductor assembly;

S2, welding: executing a plurality of steps S1 to obtain a plurality of inductor assemblies, preparing a connecting plate, wherein the connecting plate comprises a first surface and a second surface which are opposite, the inductor assemblies are arranged on the second surface of the connecting plate, the first end surface of the winding and the first end surface of each power connecting piece are welded to bonding pads corresponding to the connecting plate, respectively; the inductor assemblies are arranged in a two-dimensional array; adjacent inductor assemblies are arranged in a mirror symmetry mode, so that arrangement positions of signal connecting pieces are matched with each other, and the arrangement positions of the signal connecting pieces are located on a common edge between the inductor assemblies;

S3, plastic packaging: plastic packaging is carried out on the connecting plate and the inductor assembly, part of plastic packaging materials on the bottom surface of the plastic packaging body are removed through laser after plastic packaging, so that part of the second surface of the inductor assembly is exposed out of the bottom surface of the plastic packaging body, and the second end surface of the winding and the second end surface of each power connecting piece are exposed out of the bottom surface of the plastic packaging body;

S4, drilling and electroplating: in the arrangement position of the signal connecting piece, drilling the plastic packaging body from the bottom of the plastic packaging body to form a through hole, wherein the through hole penetrates through the plastic packaging body; electroplating the exposed bottom surface to form an electroplated layer, wherein the exposed bottom surface includes a side wall of the through hole and the second surface of the inductor assembly;

S5, etching: etching the electroplated layer to form a conductive pattern, and forming a plurality of bonding pads;

S6, secondary welding: welding the switch unit and the input capacitor on a first surface of the connecting plate;

S7, dividing plates: dividing plates along the common edge, so that the side walls of the through holes are divided into two half-hole electroplating pieces to form the signal connecting piece.

7. The production process of claim 6, wherein in the step S4, the through hole further penetrates through the connecting plate; and two ends of the signal connecting piece are electrically connected with the first surface of the connecting plate and the second surface of the inductor assembly, respectively.

8. The production process of claim 6, wherein the connecting plate is a connecting copper foil which is prefabricated and formed and is provided with a circuit diagram.

9. The production process of claim 6, wherein the connecting plate is a connecting copper foil without a circuit diagram; and in the step S5, the conductive pattern is etched on the connecting copper foil, and a plurality of bonding pads are formed.

10. The production process of claim 6, wherein the connecting plate is a printed circuit board or a ceramic substrate, and the exposed surface in the step S4 includes the first surface of the connecting plate.

11. The production process of claim 6, wherein a layout of the two-dimensional array is set as an array arrangement of a 2×2 rectangular structure, and the arrangement position of the signal connecting piece is within a 2×2 rectangular structure.

12. The POL integrated power supply module of claim 4, wherein the signal connecting piece penetrates through the plastic packaging body until the second surface of the substrate and is electrically connected with the switch unit through the substrate.

13. The POL integrated power supply module of claim 4, wherein the signal connecting piece penetrates through the plastic packaging body and the substrate and is electrically connected with the switch unit through the substrate.

14. The POL integrated power supply module of claim 4, wherein the POL integrated power supply module further comprises a bonding pad, the bonding pad is arranged on the bottom surface of the plastic packaging body, the bonding pad is connected with the second end surface of the winding, the second end surface of each power connecting piece and the signal connecting piece.

15. The POL integrated power supply module of claim 14, wherein the bonding pad, the inductor assembly, the substrate and the switch unit are sequentially stacked.

16. The POL integrated power supply module of claim 1, the input capacitors are respectively arranged on two opposite sides of the switch unit; each switch unit comprises two pairs of input pins and ground pins, and the input capacitors are bridged between each pair of input pins and ground pins.

17. The POL integrated power supply module of claim 16, wherein an input loop formed by the two VIN power connecting pieces, the two GND power connecting pieces and the input capacitor has a resonant frequency fcl; and the POL integrated power supply module is provided with a switching frequency fsw, and the resonant frequency fcl and the switching frequency fsw meet a condition that (⅓)*fsw≤fcl≤(⅔)*fsw.

18. The POL integrated power supply module of claim 17, wherein the resonant frequency fcl is half of the switching frequency fsw.

19. The POL integrated power supply module of claim 1, wherein the substrate comprises one of a printed circuit board or a ceramic substrate.

20. The POL integrated power supply module of claim 1, wherein the substrate is a copper foil.

21. The POL integrated power supply module of claim 20, wherein wrapping of the copper foil is prefabricated and formed, or the copper foil is arranged on the inductor assembly and then is etched to form a circuit diagram.

22. The POL integrated power supply module of claim 1, wherein the POL integrated power supply module is used for vertical power supplying to a processor load of an optical module.

* * * * *